United States Patent
Driemel (10) Patent No.: US 10,345,402 B2
(45) Date of Patent: Jul. 9, 2019

(54) INTERNAL CONTACTING AND CABLE ROUTING OF A HEAD COIL WITH TILTING FUNCTION

(71) Applicant: Daniel Driemel, Oederan (DE)

(72) Inventor: Daniel Driemel, Oederan (DE)

(73) Assignee: Siemens Aktiengesellschaft, Munich (DE)

( * ) Notice: Subject to any disclaimer, the term of this patent is extended or adjusted under 35 U.S.C. 154(b) by 324 days.

(21) Appl. No.: 14/824,599

(22) Filed: Aug. 12, 2015

(65) Prior Publication Data

US 2016/0047868 A1 Feb. 18, 2016

(30) Foreign Application Priority Data

Aug. 13, 2014 (DE) .......................... 10 2014 216 077

(51) Int. Cl.
| | | |
|---|---|---|
| *G01R 33/34* | (2006.01) | |
| *G01R 33/30* | (2006.01) | |
| *G01R 33/385* | (2006.01) | |
| *G01R 33/36* | (2006.01) | |
| *G01R 33/3415* | (2006.01) | |
| *A61B 5/055* | (2006.01) | |

(52) U.S. Cl.
CPC ............ *G01R 33/34* (2013.01); *G01R 33/30* (2013.01); *G01R 33/34007* (2013.01); *G01R 33/36* (2013.01); *G01R 33/385* (2013.01); *G01R 33/34046* (2013.01)

(58) Field of Classification Search
CPC .. G01R 33/34; G01R 33/30; G01R 33/34007; G01R 33/36; G01R 33/385; G01R 33/34046
See application file for complete search history.

(56) References Cited

U.S. PATENT DOCUMENTS

| | | | | |
|---|---|---|---|---|
| 6,177,797 | B1 * | 1/2001 | Srinivasan | ....... G01R 33/34046 324/318 |
| 2001/0007054 | A1 * | 7/2001 | Furuta | .............. G01R 33/34053 600/422 |

(Continued)

FOREIGN PATENT DOCUMENTS

| | | |
|---|---|---|
| DE | 10314215 B4 | 11/2006 |
| DE | 102009036938 A1 | 2/2011 |

(Continued)

OTHER PUBLICATIONS

Clinical Application of 3D/4D MR Angiography in Cardiovascular Diseases; J. Barkhausen u.a., Department of diagnostic and Interventional Radiology and Neuroradiology University Hospital Essen, Germany Magnetom Flash Feb. 2007, pp. 61-66; 2007.

(Continued)

*Primary Examiner* — Amanda Lauritzen Moher
*Assistant Examiner* — Katherine M McDonald
(74) *Attorney, Agent, or Firm* — Lempia Summerfield Katz LLC (57) ABSTRACT

The embodiments relate to a head coil for an imaging MRT system. The head coil includes a head coil upper part and a head coil lower part. At least the head coil upper part may be tilted relative to the head coil lower part, and an internal connecting cable of the head coil is embodied as a rigid-flex circuit board with a rigid region and a flexible region.

22 Claims, 14 Drawing Sheets

(56) References Cited

U.S. PATENT DOCUMENTS

| | | | |
|---|---|---|---|
| 2005/0099179 A1* | 5/2005 | Monski, Jr. | G01R 33/34046 324/318 |
| 2005/0127914 A1 | 6/2005 | Eberler et al. | |
| 2011/0037470 A1 | 2/2011 | Driemel et al. | |
| 2012/0182015 A1 | 7/2012 | Driemel et al. | |
| 2013/0023756 A1 | 1/2013 | Driemel et al. | |
| 2013/0184563 A1 | 7/2013 | Driemel | |

FOREIGN PATENT DOCUMENTS

| | | |
|---|---|---|
| DE | 102010027295 A1 | 1/2012 |
| DE | 102011079565 A1 | 1/2013 |
| DE | 102011079575 A1 | 1/2013 |

OTHER PUBLICATIONS

German Office Action for Related German Application No. 10 2014 216 077.4, dated May 6, 2015, with English Translation.

* cited by examiner

INTERNAL CONTACTING AND CABLE ROUTING OF A HEAD COIL WITH TILTING FUNCTION

CROSS-REFERENCE TO RELATED APPLICATIONS

This application claims the benefit of DE 10 2014 216 077.4, filed on Aug. 13, 2014, which is hereby incorporated by reference in its entirety.

TECHNICAL FIELD

The embodiments relate to a head coil.

BACKGROUND

Magnetic resonance devices (MRTs) for examining objects or patients using magnetic resonance tomography are known, for example, from DE 103 14 215 B4.

SUMMARY

The scope of the present invention is defined solely by the appended claims and is not affected to any degree by the statements within this summary. The present embodiments may obviate one or more of the drawbacks or limitations in the related art.

It is an object of the present embodiments to optimize a head coil.

DETAILED DESCRIPTION

Figure 14:
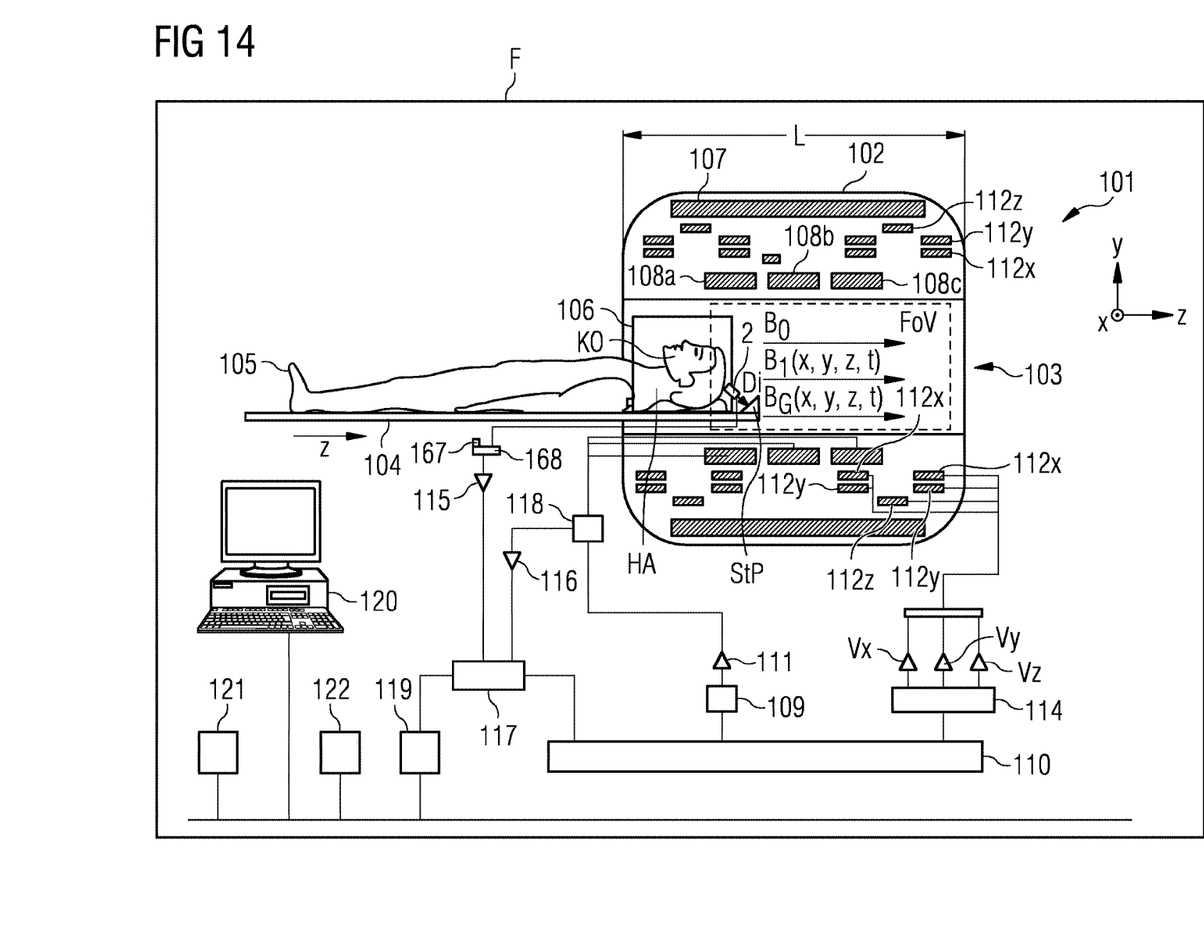
FIG. 14 schematically depicts an example of a MRT system.

FIG. 14 depicts an imaging magnetic resonance device MRT 101 (contained in a shielded room or Faraday cage F) including a hollow cylinder 102 having an in this case tubular bore 103 into which a patient couch 104 bearing a body 105 (e.g., of an examination object or a patient) (with or without local coil arrangement 106) may be introduced in the direction of the arrow z so that images of the patient 105 may be generated by an imaging method. Disposed on the patient here is a local coil arrangement 106, which may be used in a local region (also referred to as field of view or FOV) of the MRT to generate images of a subregion of the body 105 in the FOV. Signals of the local coil arrangement 106 may be evaluated (e.g., converted into images, stored, or displayed) by an evaluation device (168, 115, 117, 119, 120, 121, etc.) of the MRT 101 that may be connected to the local coil arrangement 106 (e.g., via coaxial cable or wirelessly 167, etc.).

When a magnetic resonance device MRT 101 is used in order to examine a body 105 (e.g., an examination object or a patient) by magnetic resonance imaging, different magnetic fields coordinated with one another with the utmost precision in terms of their temporal and spatial characteristics are radiated onto the body 105. A strong magnet (e.g., a cryomagnet 107) in a measurement chamber having an in this case tunnel-shaped bore 103 generates a strong static main magnetic field Bo ranging, e.g., from 0.2 Tesla to 3 Tesla or more. A body 105 that is to be examined, supported on a patient couch 104, is moved into a region of the main magnetic field Bo that is approximately homogeneous in the area of observation FoV ("Field of View"). The nuclear spins of atomic nuclei of the body 105 are excited by way of magnetic radio-frequency excitation pulses $B_1(x, y, z, t)$ emitted via a radio-frequency antenna (and/or a local coil arrangement, if necessary), depicted here in simplified form as a body coil 108 (e.g., multipart=108a, 108b, 108c). Radio-frequency excitation pulses are generated, e.g., by a pulse generation unit 109 controlled by a pulse sequence control unit 110. Following amplification by a radio-frequency amplifier 111, the pulses are directed to the radio-frequency antenna 108. The radio-frequency system depicted here is indicated only schematically. In certain examples, more than one pulse generation unit 109, more than one radio-frequency amplifier 111, and a plurality of radio-frequency antennas 108a, b, c may be used in a magnetic resonance device 101.

The magnetic resonance device 101 also has gradient coils 112x, 112y, 112z by which magnetic gradient fields $B_G(x, y, z, t)$ are radiated in the course of a measurement in order to provoke selective layer excitation and for spatial encoding of the measurement signal. The gradient coils 112x, 112y, 112z are controlled by a gradient coil control unit 114 (and if appropriate by way of amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108 and/or at least one local coil arrangement 106, amplified by assigned radio-frequency preamplifiers 116, and further processed and digitized by a receive unit 117. The recorded measurement data is digitized and stored in the form of complex numeric values in a k-space matrix. A multidimensional Fourier transform may be used to reconstruct an associated MR image from the value-populated k-space matrix.

For a coil that may be operated in both transmit and receive mode, (e.g., the body coil 108 or a local coil 106), correct signal forwarding is regulated by an upstream duplexer 118.

From the measurement data, an image processing unit 119 generates an image that is displayed to a user via an operator console 120 and/or stored in a memory unit 121. A central computer unit 122 controls the individual system components.

FIGS. 1-14 depict examples of details of advantageous embodiments.

In MR tomography, images having a high signal-to-noise ratio (SNR) may be acquired by what are termed local coil arrangements (e.g., coils, local coils). These are antenna systems mounted in immediate proximity to (e.g., on (anterior) or under (posterior)) the patient. In the course of the MR measurement, the excited nuclei induce a voltage in the individual antennas of the local coil, which voltage is then amplified by a low-noise preamplifier (LNA, preamp) and forwarded by a wired connection to the receive electronics. Systems called high-field systems (e.g., 1.5 T to 12 T and more) are employed even in the case of high-resolution images in order to improve the signal-to-noise ratio. Since more individual antennas may be connected to a MR receiving system than there are receivers present, a switching array (called RCCS in this case) is installed between receive antennas and receivers. The array routes the currently active receive channels (e.g., those channels currently lying in the magnet's field of view) to the receivers present. This enables more coil elements to be connected than there are receivers available, since in the case of whole-body coverage it is only necessary to read out those coils that are located in the field of view (FoV) or, as the case may be, in the homogeneity volume of the magnet.

The term local coil ("coil") 106 is used here in particular to refer to an antenna system that may include one antenna element (e.g., coil element) or of a plurality of antenna elements (e.g., array coil). In most cases, the individual antenna elements are implemented as loop antennas (e.g., loops) or as butterfly or saddle coils. A coil includes coil elements, the preamplifier, further electronics (standing wave traps, etc.) and cabling, the housing, and, in certain embodiments, a cable with plug-type connector by which the coil is connected to the MRT system. The receiver (RX) mounted on the system side filters and digitizes the signal received by the local coil and passes the data to the digital signal processing device that, for example, derives an image or a spectrum from the measurement and makes it available to the user for diagnostic purposes.

A head coil 106 may be embodied here in particular as a so-called "DirectConnect" head coil (e.g., a direct connection head coil), which has a so-called DirectConnect slot 2 (e.g., direct connection slot, here in the form of a plug-type connector or a socket) that may be inserted into a direct connection slot StP (here in the form of a socket or a plug-type connector) on a patient couch, which here, e.g., connects the electronics 3 of the head coil 106 by way of direct connection slots 2, StP with the electronics 117, 110 and is at the same time able to mechanically fix the head coil 106 to a position by engagement.

A head coil 106 (e.g., in the form of solely head coil or combined head/neck coil) is to be embodied here to be tiltable in order to improve patient comfort while supporting patients with pathological changes to the cervical spine (ankylosing spondylitis, torticollis, etc.), which has been made easier up to now, for instance, using wedges under the local coil or an ankylosing spondylitis adapter published in DE 10 2011 079 575 A1.

Figure 1:
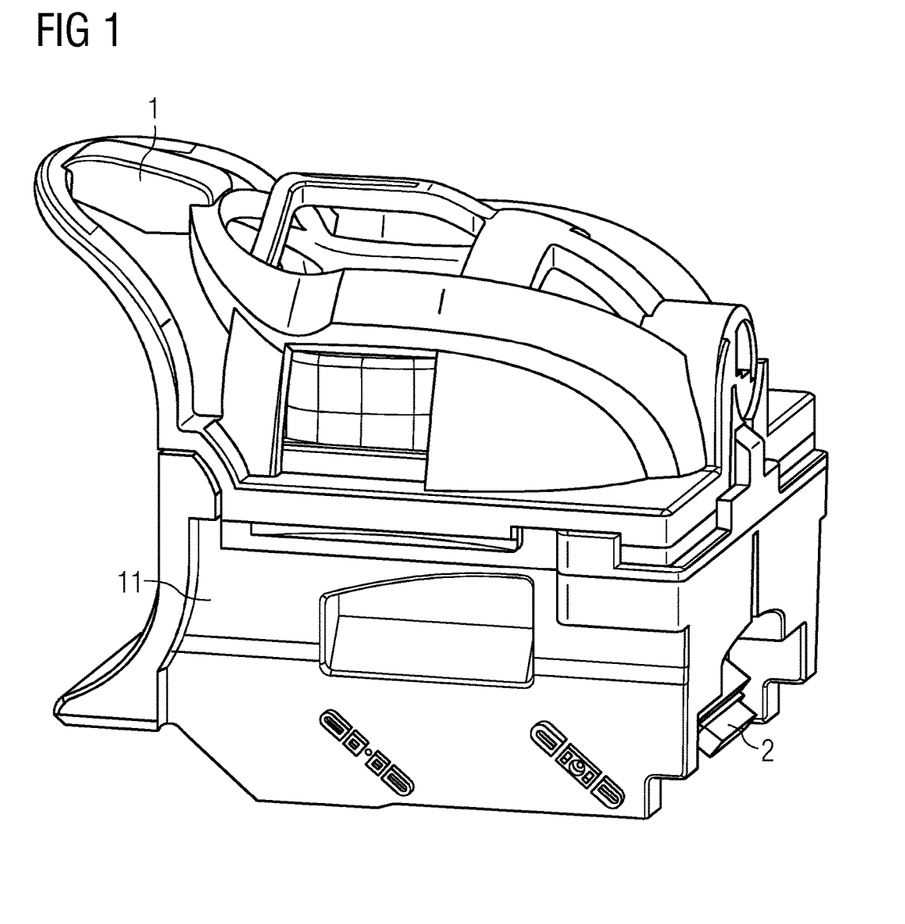
FIG. 1 depicts an example of a "DirectConnect" head coil in a side view.
Figure 2:
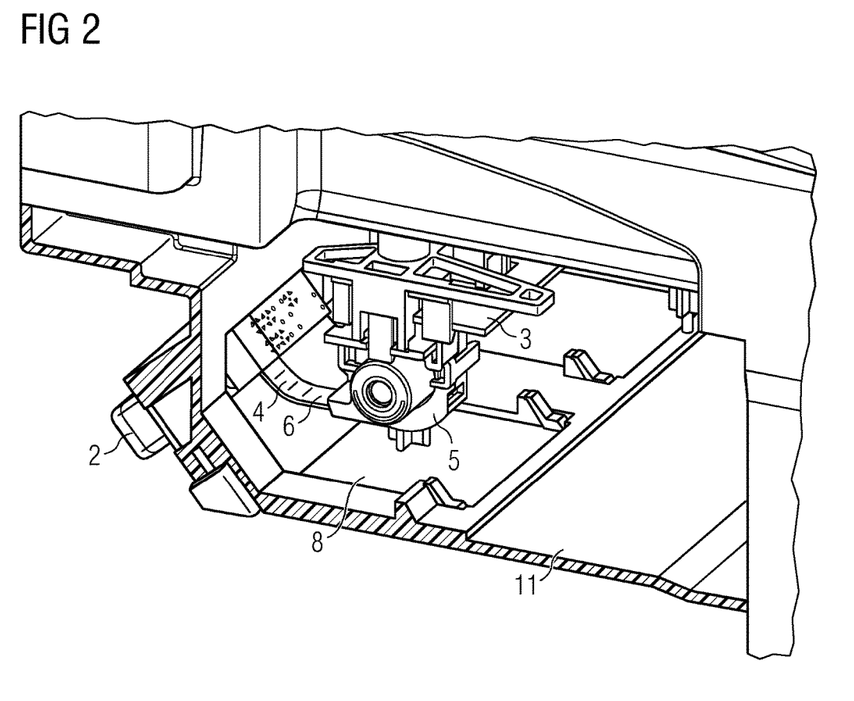
FIG. 2 depicts an example of a perspective representation of an intersected view into a detailed cutout of the "DirectConnect" head coil according to FIG. 1.
Figure 3:
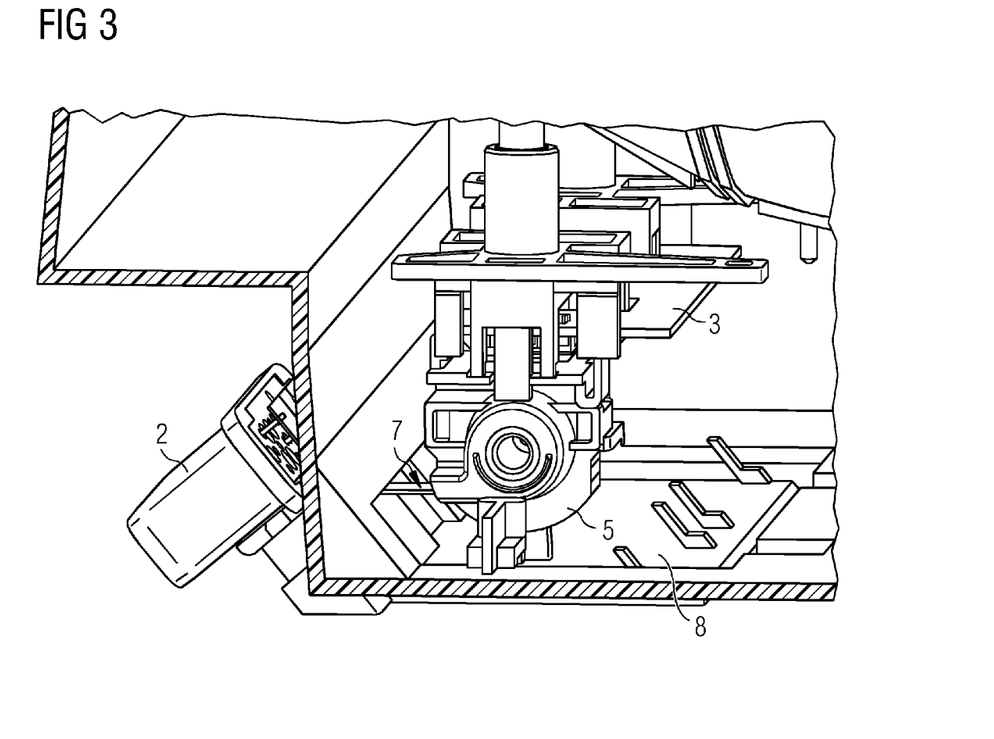
FIG. 3 depicts an example of a perspective representation of an intersected view into a tiltable head coil, in the non-tilted state.
Figure 4:
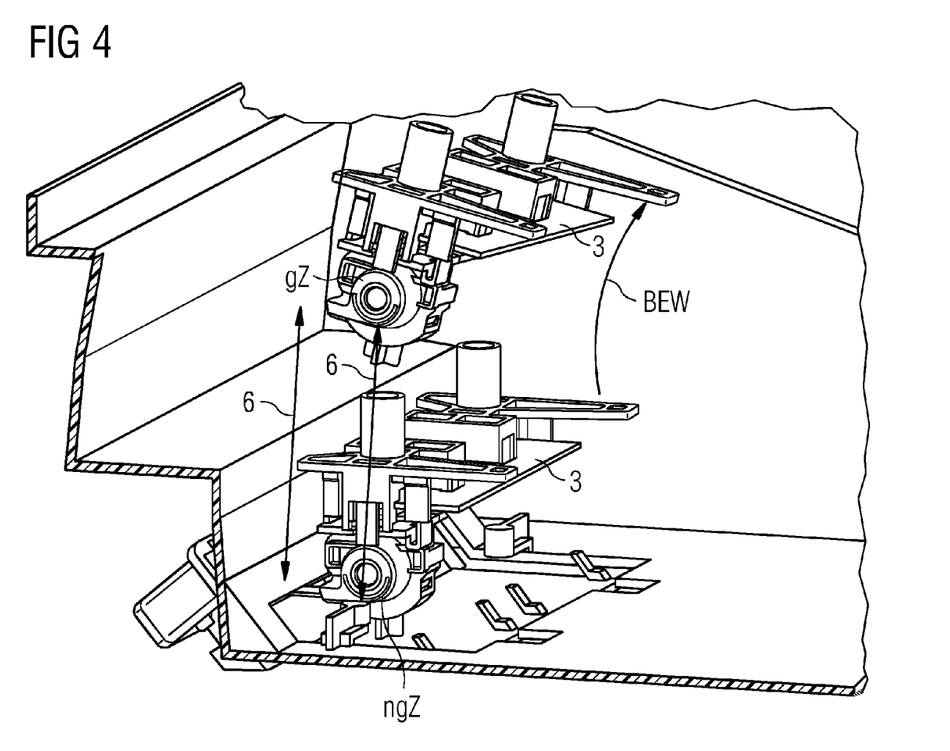
FIG. 4 depicts an example of a perspective representation of an intersected view into a tiltable head coil, below in the non-tilted state and above in the tilted state.
Figure 5:
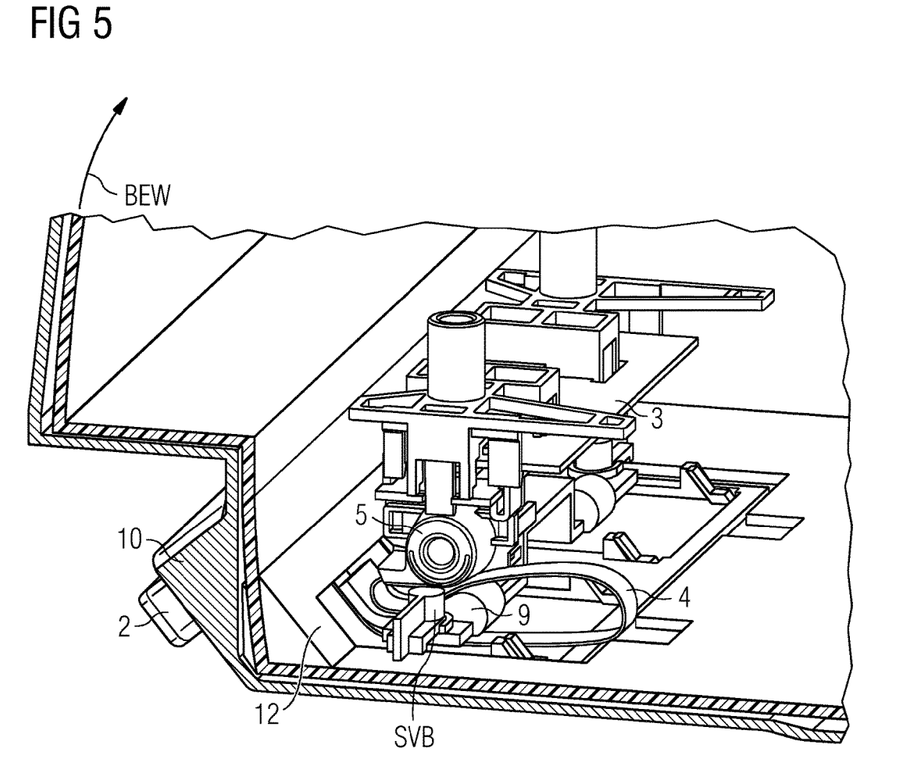
FIG. 5 depicts an example of a perspective representation of an intersected view into a tiltable head coil, in the non-tilted state, having an internal connecting cable of the head coil embodied as a rigid-flex circuit board and a mounting piece for guiding and mounting the extended rigid-flex circuit board.

A head coil 106 (e.g., with an upper part 1 and a head coil lower part 11) depicted in the side view in FIG. 1 and as a detailed cutout in FIG. 2 and "DirectConnect" head coils may not be tilted and tiltable head coils have an external connecting cable fastened to the movable part of the coil.

Figure 12:
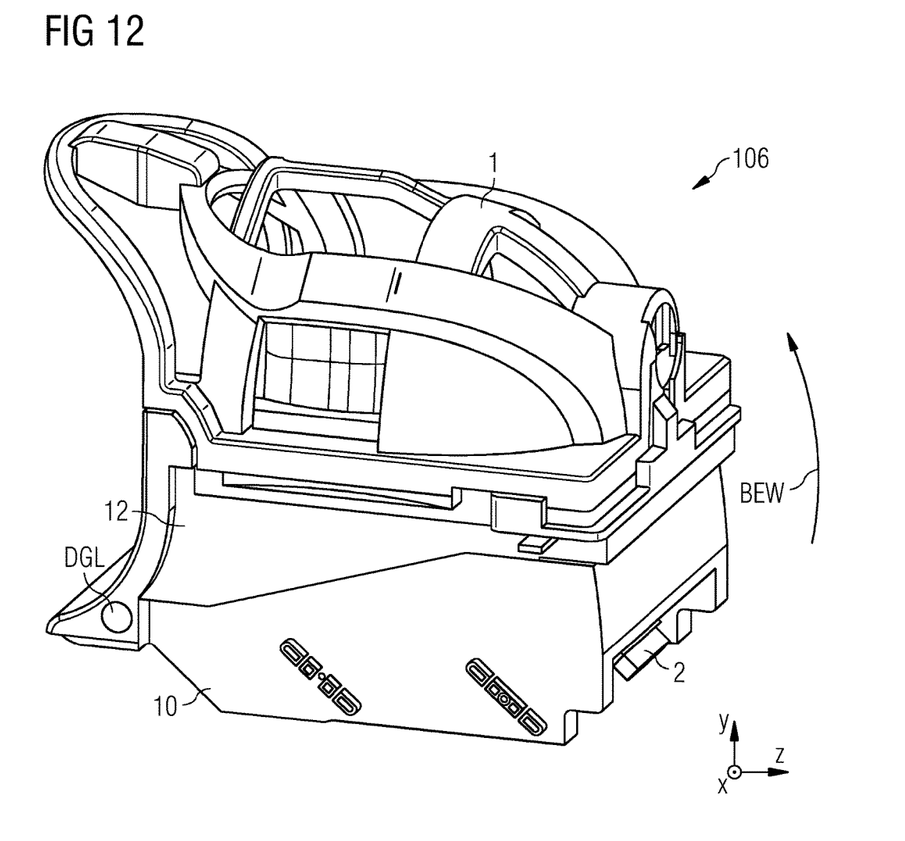
FIG. 12 depicts an example of a perspective view of a non-tilted head coil.
Figure 13:
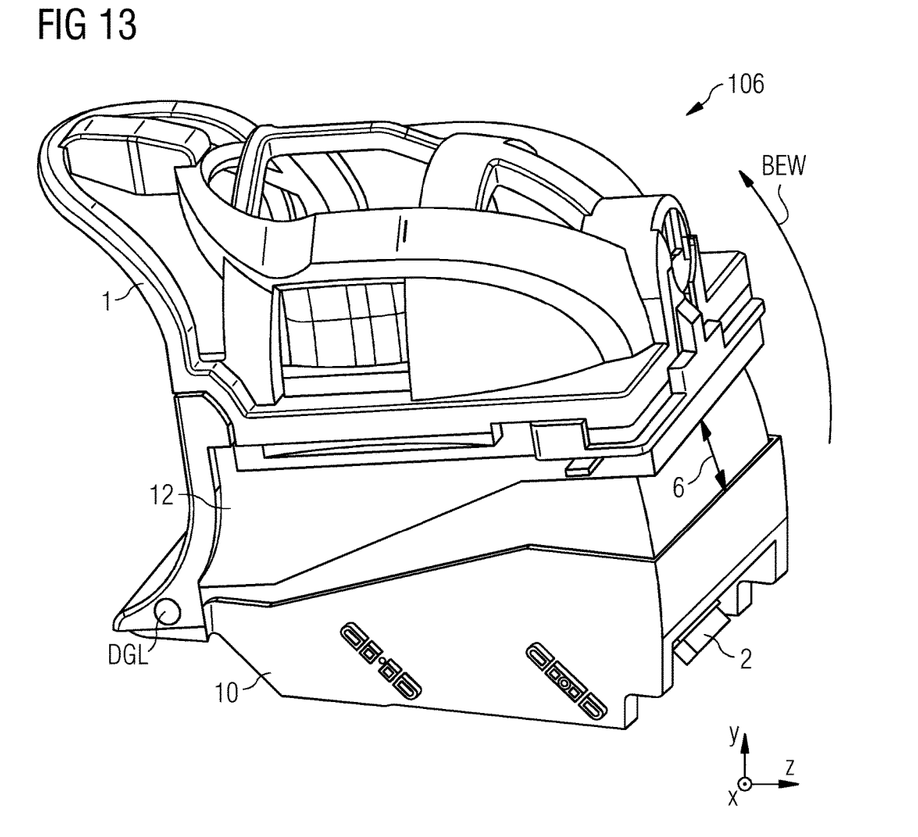
FIG. 13 depicts an example of a perspective view of a tilted head coil.

FIGS. 12 and 13 illustrate a tilting of an embodiment of a head coil 106.

The head coil lower part 11 includes a base part 10 of the head coil lower part 11, and a movable part 12 of the head coil lower part 11, upon which 12 the upper part 1 of the head coil 106 is placed if the head of the patient 105 is disposed in the movable part 12 of the head coil lower part 11. The lower region of the movable part 12 of the head coil lower part 11 is disposed in a tiltable manner in the base part 10 of the head coil lower part 11, which base part 10 rests (e.g., untiltable) on the patient couch 104. The movable part 12 of the head coil lower part 11 may be moved tilting about e.g. a swivel DGL in the direction of the arrow BEW relative to the base part 10 of the head coil lower part 11 (e.g., with locking devices) from the position in FIG. 12 into e.g. the position in FIG. 13; an upper part 1 of the head coil 106 that rests on the movable part 12 of the head coil lower part 11 is tilted in the direction BEW using the movable part 12.

In an embodiment of a "DirectConnect" head coil 106 that may be tilted in accordance with FIGS. 3-14, when the head coil 106 is tilted for instance, the "DirectConnect" slot 2 remains fixed relative to the patient couch 104 (or StP). Additionally, a remaining part, (e.g., upper part 1, here upper part 1 together with the movable part 12 of the head coil lower part 11, on which 12 the upper part 1 rests), of the local coil 106 with the electronics 3 distances itself therefrom in the direction of the arrow BEW with a tilting movement BEW from the position in FIG. 3 and in FIG. 4 downwards (e.g., non-tilted state ngZ) into the position (e.g., tilted state gZ) in FIG. 4 upwards (e.g., according to a tilting movement BEW from the position in FIG. 12 into the position in FIG. 13 and a tilting movement from the position in FIG. 6 into the position in FIG. 7). In order to compensate this path, internal cable lengths (e.g., of an internal connecting cable 4) are to be retained here, which are reliably displaced and fastened in a vibration-free manner.

The internal connecting cable 4 of the head coil 106 is not to bridge the distance difference 6 between the states "not tilted-tilted" (ngZ→gZ) between the "DirectConnect" slot 2 in the head coil 106 and the head coil-internal electronics 3. This is approximately 120 mm for a maximum 20° tilt angle. A rigid-flex circuit board 4 is used herefor. The rigid parts of the rigid-flex circuit board 4 are the transitions STA1 to the "DirectConnect" slot 2 and STA2 to the local coil-internal electronics 3 or standing wave trap. The region FLE of the rigid-flex circuit board 4 therebetween is flexible (e.g., bendable).

The standing wave trap 5 already present nowadays in a non tiltable "DirectConnect" head coil is also used here unmodified.

The additionally required cable length 6 (e.g., according to the distance difference 6) is to be introduced between the direct plug-in mount 2 and standing wave trap 5, because the distance between the standing wave trap 5 and the internal electronics 3 is to remain constant during tilting BEW. The installation space 7 available for this is limited here. The standing wave trap 5 rests on the so-called service cover 8 in the existing non-tiltable head coil so that it does not interrupt the contacting with the internal electronics 3 on account of the vibrations of the MR system.

In order to solve these problems in the tiltable head coil, a mounting piece 9 depicted in FIGS. 5-11 is provided, wherein, in the existing installation space, the mounting piece 9 realizes the guidance and mounting of the extended rigid-flex circuit board 4.

The rigid-flex circuit board 4 assumes, as already mentioned, the contacting of the "DirectConnect" plug-in mount 2, via the standing wave trap 5 to the internal electronics 3. It is fastened with its direct plug-type connector 2 to the base part 10 of the head coil lower part 11.

The mounting piece 9 is attached to the movable part 12 of the head coil lower part 11. This may take place, for instance, by a screw or locking connection SVB. The use of the flexible circuit board 4, which behaves like a flat ribbon cable (e.g., in its flexible central region), is advantageous because the circuit board 4 is flexible in the movement direction and rigid in the other dimension.

Figure 6:
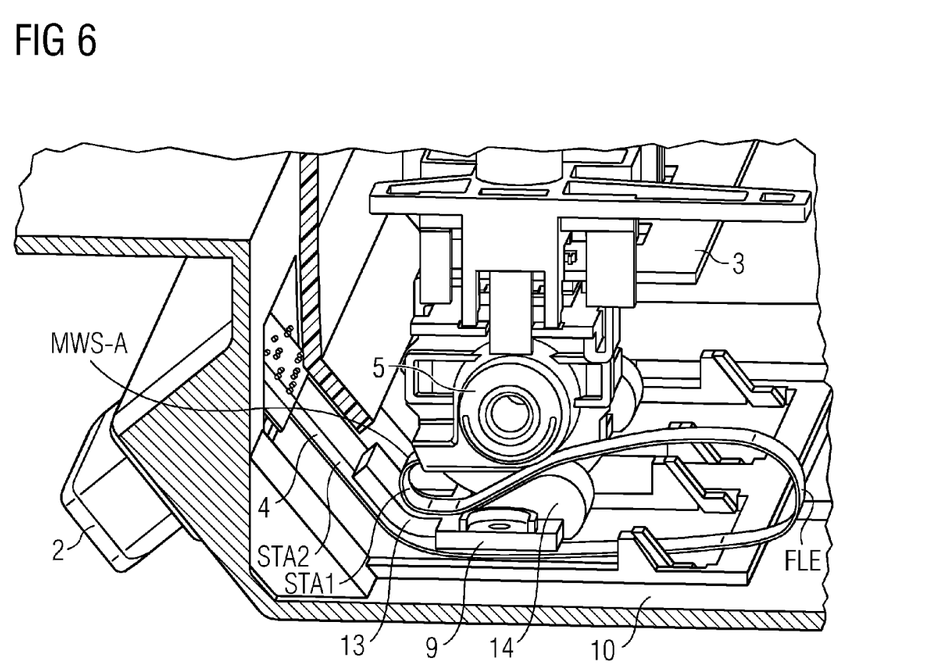
FIG. 6 depicts an example of a perspective representation that differs from the perspective representation depicted in FIG. 5 of an intersected view into a tiltable head coil, in the non-tilted state, having an internal connecting cable of the head coil embodied as a rigid-flex circuit board and two mounting pieces for guiding and mounting the extended flex circuit board in each case.

A separating wall region 13 of the mounting piece 9 is visible in FIG. 6, the separating wall region preventing the flex circuit board 4 from contacting itself in loops. Otherwise, the loops of the flex circuit board 4 may "rub" each other when the head coil is tilted, which may result in a short-circuit and coil failure resulting therefrom.

Moreover the mounting piece 9 has a bevel 14, which produces a narrow positively driven operation of the flex circuit board 4 directly at the output MWS-A of the standing wave trap 5, in order here to achieve a virtually rigid deflection of the flex circuit board 4.

On account of the minimal installation space, it is useful to deflect the flex circuit board 4 once with a small bending radius.

The form-fit by the bevel 14 provides that the tilting movement of the head coil at this point does not result in an alternating bending movement of the flex circuit board 4, because alternating bending stress with such a narrow deflection may result in conductor failure.

Figure 7:
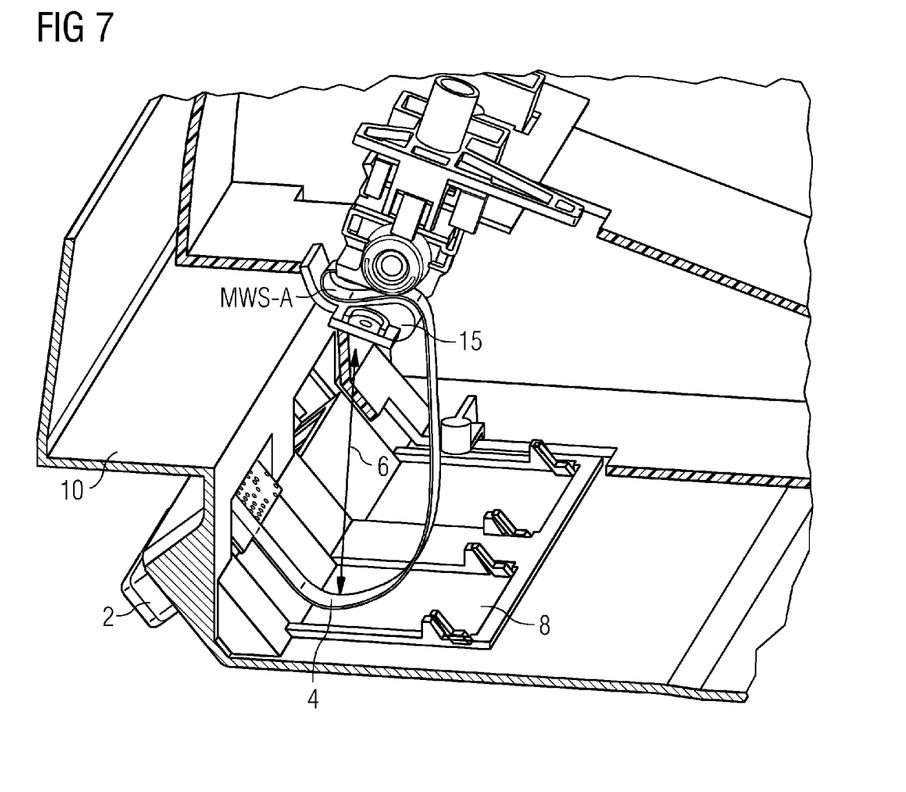
FIG. 7 depicts an example of a perspective representation of an intersected view into a tiltable head coil, in the tilted state, with a radius on the mounting piece.

FIG. 7 depicts that the mounting piece 9 also has a radius 15. In the tilted state of the head coil 106 and at the same time elongated state of the flex circuit board 4, this radius 15 prevents a kinking and generates a bending radius required for the long-term alternating bending stress of the flex circuit board.

Figure 8:
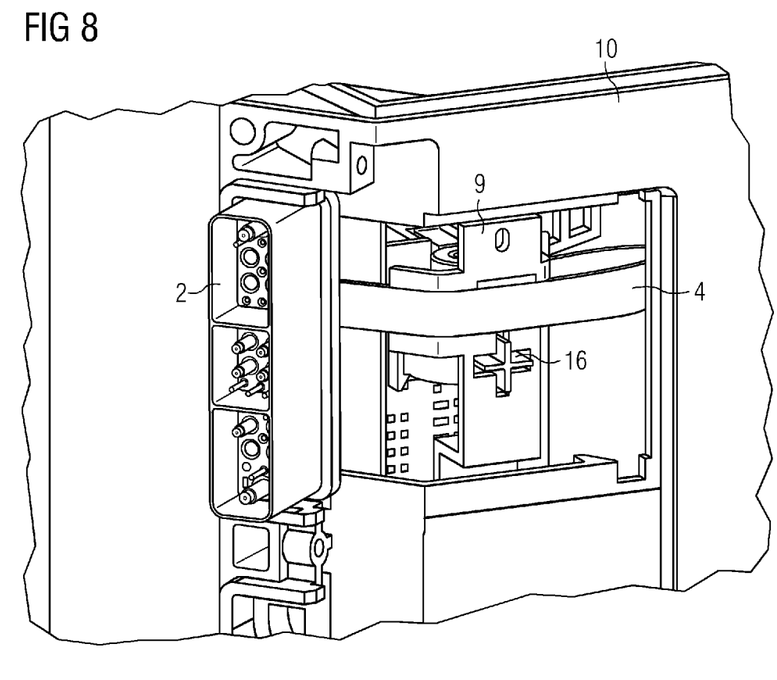
FIG. 8 depicts an example of a perspective representation of a cutout of a tiltable head coil, having a "DirectConnect" slot, a form-fit contour and an opened service cover.
Figure 9:
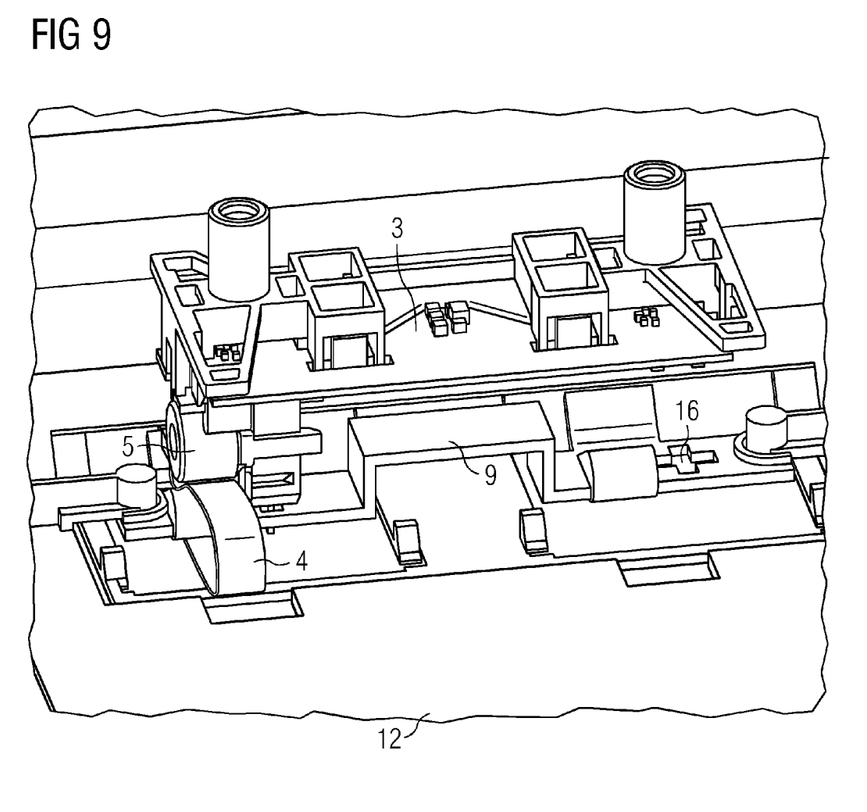
FIG. 9 depicts an example of a perspective representation of a view into a head coil lower part having two mounting pieces and a rigid-flex circuit board.

As FIGS. 8 and 9 depict, a form-fit contour 16 is introduced in order to receive the standing wave trap 5 in the mounting piece 9. The standing wave trap housing may pass therethrough and at the same time rests on the mounting piece 9. The standing wave trap 5 is plugged onto the internal electronics 3 by way of the rigid-flex circuit board 4. The mounting piece 9 fixed to the movable head coil lower part 12 prevents a release of this internal plug-in connection as a result of the vibrations caused by operation of the MR system.

Figure 10:
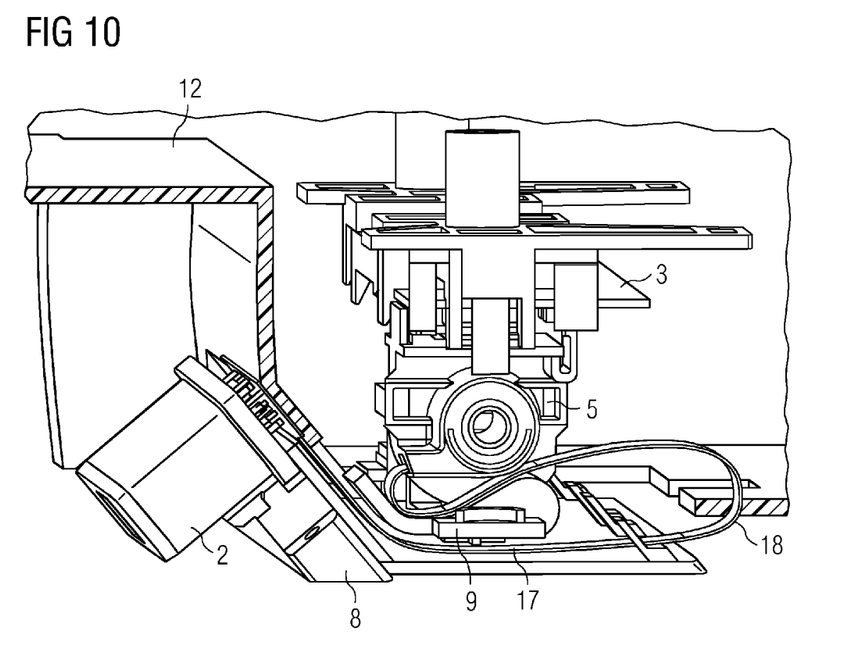
FIG. 10 depicts an example of a perspective representation of a gap between a mounting piece and a service cover.

The gap 17 visible in FIG. 10 between the mounting piece 9 and the service cover 8 is also used to positively drive the flex circuit board 4 and in the non-tilted state of the head coil, (e.g., in the compressed state of the flex circuit board 4), generates a kink-free large deflection radius 18.

The mounting piece 9 may also be designed as a function of the number of channels of the head coil and the interface with the patient couch 104 for a number of flex circuit boards 4 with (e.g., in each instance) an associated standing wave trap. Here, the form-fit 16 between the standing wave trap 5 and the mounting piece 9, also in the mounting direction, with respect to the individual plug-in modules, have a play for tolerance compensation.

Figure 11:
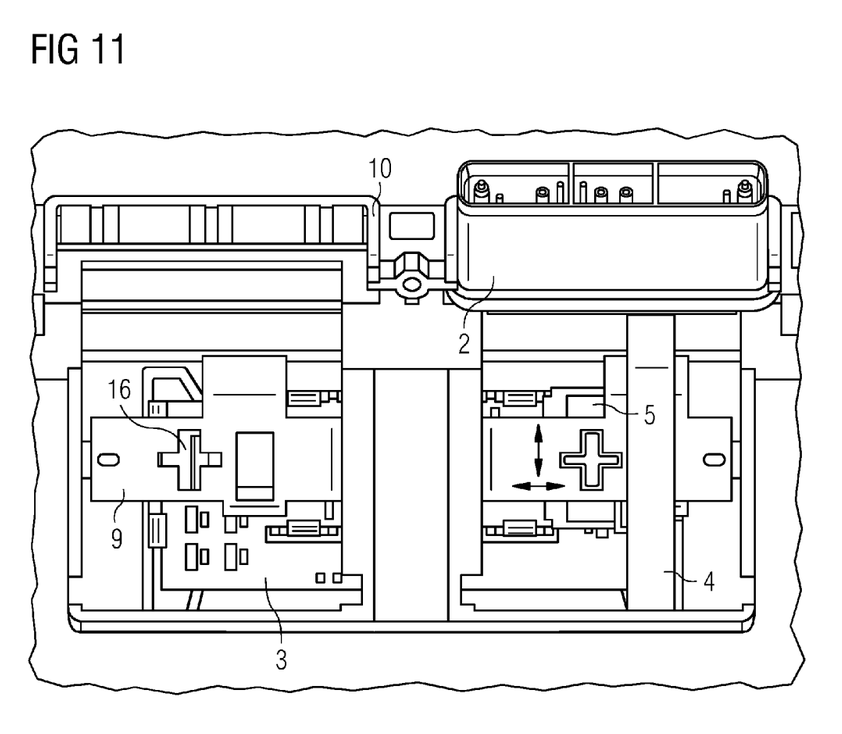
FIG. 11 depicts an example of a perspective view into a "DirectConnect" slot, when the service cover is open.

As FIG. 11 depicts, on account of its design and attachment, the mounting piece 9 also allows the rigid-flex circuit board 4 including plug-in module with the patient couch and standing wave trap 5 to be able to be replaced on site by way of the service cover 8 in the event of a fault.

Possible advantages and implementations of the above-referenced embodiments may be one or more of the following. For one, internal contacting of a tiltable "DirectConnect" head coil with a rigid-flex circuit board may be elongated and compressed. Second, a mounting piece may be provided for securing the plug-in connection of the flex circuit board with the standing wave trap with respect to internal electronics, in order to prevent the influence of vibrations from the MR system on the contacting. Third, the mounting piece may prevent contact with the flex circuit board by a separating wall 13. Fourth, the mounting piece may generate a positively driven operation of the flex circuit board by the bevel 14 in order to prevent a movement in the deflection region at the output MWS-A of the standing wave trap 5. Fifth, the mounting piece may have a radius 15 that prevents a kinking of the flex circuit board in the elongated state. Sixth, in the non-tilted state of the head coil (e.g., flex circuit board compressed), the mounting piece may generate a narrow gap relative to the service cover 8, which automatically forms a larger radius in the flexible circuit board. A kinking in the compressed state is thus prevented. Seventh, the mounting piece may be designed for one or a number of plug-in modules. Eighth, the mounting piece may be configured such that if a service cover 8 is removed, it enables the customer to replace the rigid-flex module. Ninth, cost-effective production may be a plastic injection molded part. Tenth, the material used may be MR silent, such as polyamides (PA), polycarbonates (PC), or polybutylene terephthalates (PBT).

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A head coil for an imaging magnetic resonance tomography (MRT) system, the head coil comprising:
   a head coil upper part; and a head coil lower part, wherein the head coil upper part is configured to move between a tilted state and a non-tilted state relative to the head coil lower part;

an internal connecting cable connected between the head coil upper part and the head coil lower part, wherein the internal connecting cable is a rigid-flex circuit board having a first rigid region, a second rigid region, and a flexible region positioned between the first and the second rigid regions; and a mounting piece attached to the head coil lower part, wherein a length of the internal connecting cable is configured to be elongated in the tilted state of the head coil and compressed in the non-tilted state, and wherein the flexible region of the rigid-flex circuit board is routed through the mounting piece in the non-tilted state of the head coil.

2. The head coil as claimed in claim 1, wherein the first rigid region is connected to a direct plug-in mount and the second rigid region is connected to internal electronics of the head coil.

3. The head coil as claimed in claim 1, wherein a length of the internal connecting cable is dimensioned in order to bridge a distance between a slot and internal electronics in the tilted state of the head coil.

4. The head coil as claimed in claim 3, wherein a standing wave trap is connected to the internal electronics.

5. The head coil as claimed in claim 1, wherein a length of the internal connecting cable is sufficient to bridge a path between a slot and internal electronics in the non-tilted state of the head coil, and wherein, in the non-tilted state of the head coil, the internal connecting cable has an additional length of at least 120 mm.

6. The head coil as claimed in claim 1, wherein the internal connecting cable comprises a standing wave trap or contacts the standing wave trap.

7. The head coil as claimed in claim 1, wherein an additional length of the internal connecting cable, required in the tilted state of the head coil compared with the non-tilted state of the head coil, runs between a direct plug-in mount and a standing wave trap of the head coil in the non-tilted state of the head coil.

8. The head coil as claimed in claim 1, wherein the mounting piece is attached to a movable part of the head coil lower part.

9. The head coil as claimed in claim 8, wherein the mounting piece is attached to the movable part by a screw or locking connection.

10. The head coil as claimed in claim 8, wherein the mounting piece comprises a separating wall configured to prevent contact of the rigid-flex circuit board in loops with itself.

11. The head coil as claimed in claim 8, wherein the mounting piece comprises a bevel configured to generate a guidance of the rigid-flex circuit board directly at an output of a standing wave trap.

12. The head coil as claimed in claim 11, wherein the bevel is configured to obtain a rigid deflection of the rigid-flex circuit board.

13. The head coil as claimed in claim 8, wherein the mounting piece is configured to deflect the rigid-flex circuit board once with a small bending radius.

14. The head coil as claimed in claim 8, wherein the mounting piece has a radius configured for one or more of the following:

to prevent a kinking in (1) the tilted state of the head coil and, at a same time, (2) a compressed state of the rigid-flex circuit board, or to generate a bending radius of the rigid-flex circuit board.

15. The head coil as claimed in claim 8, wherein the mounting piece is configured to receive a standing wave trap, the mounting piece comprising a form-fit contour with an embodiment through which the standing wave trap housing is configured to pass.

16. The head coil as claimed in claim 8, wherein the mounting piece is configured for a number of rigid-flex circuit boards with an associated standing wave trap, wherein a form-fit between the standing wave trap and the mounting piece has a play for tolerance compensation, in a mounting direction, with respect to individual plug-in modules.

17. The head coil as claimed in claim 8, wherein the mounting piece is configured and arranged such that the rigid-flex circuit board, a plug-in module, or the rigid-flex circuit board and the plug-in module are removable by an open service cover.

18. The head coil as claimed in claim 8, wherein the mounting piece is a plastic injection molded part.

19. The head coil as claimed in claim 8, wherein the mounting piece is made of a polyamide, polycarbonate, or polybutylene terephthalate.

20. The head coil as claimed in claim 1, wherein a gap is provided between a mounting piece and a service cover for a positively driven operation of the rigid-flex circuit board and, in the non-tilted state of the head coil and a compressed state of the rigid-flex circuit board, generates a kink-free large deflection radius.

21. The head coil as claimed in claim 1, wherein the head coil is configured for either imaging solely a head of a patient, or is configured as a combined head/neck local coil for imaging the head and a neck of the patient.

22. The head coil as claimed in claim 1, wherein the flexible region of the internal connecting cable comprises a kink-free large deflection radius when the internal connecting cable is in the compressed state.

* * * * *